US010310476B2

(12) United States Patent
Dhanjal et al.

(10) Patent No.: US 10,310,476 B2
(45) Date of Patent: Jun. 4, 2019

(54) USING LINKED-LISTS TO CREATE FEATURE RICH FINITE-STATE MACHINES IN INTEGRATED CIRCUITS

(71) Applicant: Analog Devices Global Unlimited Company, Hamilton (BM)

(72) Inventors: Navdeep Singh Dhanjal, San Jose, CA (US); Shengbing Zhou, Beijing (CN)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/958,871

(22) Filed: Apr. 20, 2018

(65) Prior Publication Data

US 2018/0314221 A1    Nov. 1, 2018

Related U.S. Application Data

(60) Provisional application No. 62/490,431, filed on Apr. 26, 2017.

(51) Int. Cl.
| H03K 19/173 | (2006.01) |
| G05B 19/045 | (2006.01) |
| G06F 1/3296 | (2019.01) |
| H03K 19/00 | (2006.01) |
| G06F 12/0817 | (2016.01) |

(52) U.S. Cl.
CPC ......... G05B 19/045 (2013.01); G06F 1/3296 (2013.01); G06F 12/0824 (2013.01); H03K 19/0002 (2013.01); G05B 2219/23289 (2013.01)

(58) Field of Classification Search
CPC ........ G05B 19/045; G05B 2219/23289; G06F 12/0824; G06F 1/3296; H03K 19/0002
USPC .......................................................... 326/46
See application file for complete search history.

(56) References Cited

U.S. PATENT DOCUMENTS

| 9,671,846 B1* | 6/2017 | Davis .................. G06F 1/28 |
| 2012/0047376 A1* | 2/2012 | Nakajima ............. G06F 1/3237 |
| | | 713/310 |
| 2013/0082662 A1* | 4/2013 | Carre .................... H02J 7/0052 |
| | | 320/134 |
| 2016/0048184 A1* | 2/2016 | Basile .................. G06F 1/26 |
| | | 713/310 |
| 2017/0153680 A1* | 6/2017 | Girard .................. G06F 1/266 |

* cited by examiner

*Primary Examiner* — Don P Le
(74) *Attorney, Agent, or Firm* — Schwegman Lundberg & Woessner, P.A.

(57) ABSTRACT

An apparatus comprises an integrated circuit (IC) including sequencer circuitry; and a memory integral to or operatively coupled to the integrated circuit, wherein at least a portion of the memory is organized as a plurality of hierarchical linked lists defining a finite state machine of a plurality of finite IC states; wherein the sequencer circuitry is configured to: receive one or more control words from the hierarchical linked lists associated with an IC state; advance the IC to the IC state according to the one or more control words; and perform one or more actions corresponding to the IC state.

20 Claims, 6 Drawing Sheets

USING LINKED-LISTS TO CREATE FEATURE RICH FINITE-STATE MACHINES IN INTEGRATED CIRCUITS

CLAIM OF PRIORITY

This application claims priority to U.S. Provisional Application Ser. No. 62/490,431, filed on Apr. 26, 2018, and is hereby incorporated by reference herein in its entirety.

BACKGROUND

Some electronic systems include supervisory integrated circuits. For example, an electronic system may include multiple power supplies controlled by the supervisory circuits that may perform functions related to sequencing the power supplies for powering up or down and monitoring the power supplies. As electronic systems continue to become more complex it becomes a challenge to provide proper supervisory control to the electronic system. Additionally, changes to a complex electronic system can be difficult to implement.

Overview

This document relates generally to controlling electronic systems through finite state machines implemented using hierarchical linked lists. An apparatus example includes an integrated circuit (IC) including sequencer circuitry and a memory integral to or operatively coupled to the integrated circuit. At least a portion of the memory is organized as a plurality of hierarchical linked lists defining a finite state machine of a plurality of finite IC states. The sequencer circuitry is configured to: receive one or more control words from the hierarchical linked lists associated with an IC state; advance the IC to the IC state according to the one or more control words; and perform one or more actions corresponding to the IC state.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Electronic systems can include multiple integrated circuit devices that require multiple voltage domains. The systems also include multiple power supplies to provide power supply voltage rails to the multiple voltage domains. These systems may have very strict voltage sequencing requirements, which are implemented using dedicated voltage sequence controllers. A sequence controller activates power supply voltage rails for specific voltage domains in a specified order.

Figure 1:
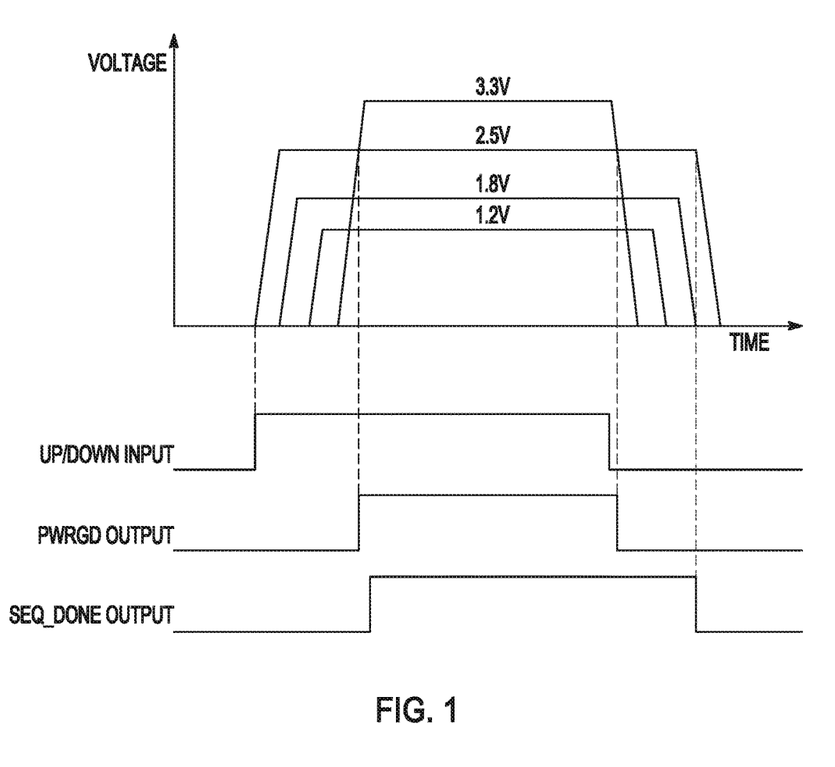
FIG. 1 is a timing diagram of an example of a power supply voltage sequencer device sequentially activating voltage domains.

FIG. 1 is a timing diagram of an example of a power supply voltage sequencer device sequentially activating voltage domains. The voltage sequencer controls and monitors power supplies that provide multiple voltages, such as voltages of 1.2 Volts (V), 1.8V, 2.5V, and 3.3V, for example. As shown in the timing diagram, the voltage sequencer activates the power supply rails in order of 2.5V, 1.8V, 1.2V, and 3.3V, and deactivates the power supply rails in reverse order.

Electronic systems continue to incorporate more devices. For example, an electronic system such as a server or a networking board can include multiple integrated circuit devices of different types, such as application specific integrated circuits (ASICS), field programmable gate arrays (FPGAs), and processors.

Figure 2:
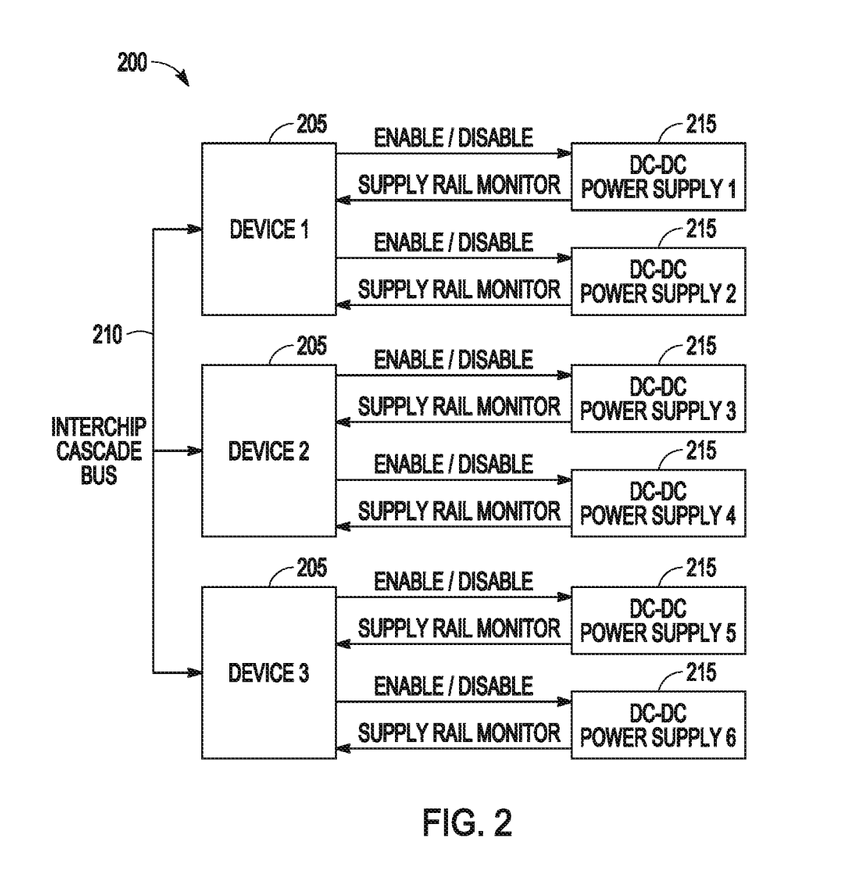
FIG. 2 is a block diagram of portions of an example of a voltage sequencer system.

FIG. 2 is a block diagram of portions of an example of a voltage sequencer system. The system 200 includes a number of individual voltage sequencer devices 205 and an inter-chip cascade bus (ICB) 210. Each voltage sequencer device can be an integrated circuit (IC) that includes control circuitry that controls multiple power supplies 215. The control circuitry may generate one or more control signals to activate and deactivate the power supplies. A control signal may have a specified voltage amplitude adequate to sufficiently turn on and turn off a specific power supply. Each voltage sequencer device may include monitoring circuitry to detect faults such as over-voltage faults and under-voltage faults in the power supplies. In certain examples, the power supplies are DC-DC power supplies. Only two power supplies are shown controlled by each voltage sequencer to simplify the example, although one voltage sequencer may actually control up to ten power supplies. The number of voltage supply rails needed for such a system can vary from 20 to 200.

Conventional voltage sequence controllers may not be able to provide the flexibility desired when implementing the voltage domains of a large electronic system. This sequencing can be implemented in hardware circuits or using a hardware-configured finite state machine (FSM) that monitors and controls various signals based on the current status of the system. Various events determine which state-to-state transition occurs according to the FSM. However, a state machine based in hardware is either not configurable or includes hard-coding to configure the FSM. If it is desired to change the system, a hard-coded solution would have to be redesigned. This can prove complex and costly for a large electronic system.

Figure 3:
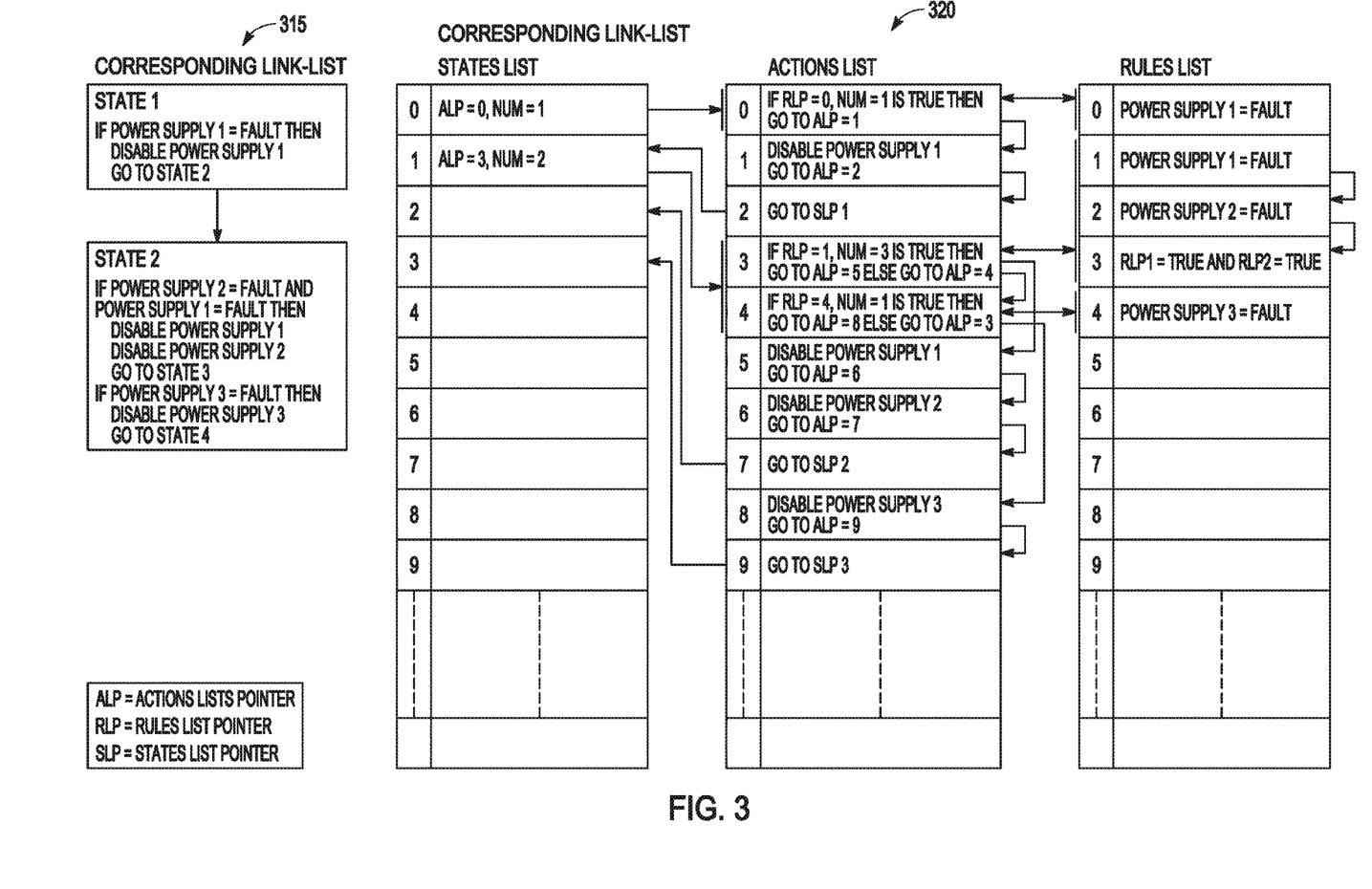
FIG. 3 is an example of a finite state machine implemented using hierarchical linked lists.

FIG. 3 is an example of a FSM implemented using hierarchical linked lists. The FSM can be used to manage the power supplies of an electronics system. To the left in FIG. 3 is a state diagram 315 of the FSM. To the right in FIG. 3 is an example of the hierarchical linked lists 320 that implement the FSM. The hierarchical linked lists include a states list and an action list. The states list includes the states of the FSM. The actions lists includes the state actions performed during a particular state. The hierarchical linked lists 320 also can include a rules list. The entries of the rules list identify one or more logic conditions associated with a state action of the actions lists.

The state diagram 315 shows two states for simplicity. In an actual system controlling one hundred power supplies, there may be hundreds of states. In the first state, Power Supply 1 is checked for a Fault. If there is a Fault, the FSM proceeds to the second state, where Power Supply 1 and Power Supply 2 are checked for Faults. If the power supplies indicate a Fault, the power supplies are disabled and the FSM proceeds to the third state. If Power Supply 3 indicates Fault, the power supply is disabled and the FSM proceeds to the fourth state.

In the FSM of the hierarchical linked lists, the states list pointer points to the states in the states list. The first state in the linked lists is State 0. The value of the actions list pointer (ALP=0) is loaded from the memory location pointed to by the states list pointer. The actions included in the memory location pointed to by the actions list pointer (the first entry of the actions list in the example) are performed. Only the first action is performed (according to value Num=1). The actions include loading the rules list pointer value and branching conditional on the logic conditions or logic values found at the memory location (the first entry of the rules list) pointed to by the rules list pointer. The first entry in the rules list includes the logic condition Fault=True.

Based on the logic condition, the actions list performs a branch to the second entry of the actions list based on the logic condition found in the rules list. The second entry of the actions list includes the action of disabling Power Supply 1 and branching to the third entry of the actions list, which is to advance the state of the FSM by loading the states pointer with the value of the next state (State 1) of the states list.

The value of the actions list pointer (ALP=3) is loaded from the memory location pointed to by the states list pointer and the actions stored in the list entry indicated by ALP=3 and the next entry are performed (according to the value Num=2). The actions in the entry for ALP=3 checks the three logic conditions at rules list entries 1 through 3, and the actions in the entry for ALP=4 checks the logic condition at rules list entry 4. Based on the logic conditions, the actions list includes a branch to disable Power Supply 1, Power Supply 2 and branch to the next state entry (State 2) of the FSM, or includes a branch to disable Power Supply 3 and a branch to State 3 of the FSM. It can be seen that the hierarchical linked lists 320 implement the state diagram 315.

In some embodiments, the hierarchical linked lists include a linked sequencer list. The sequencer list includes available state sequences and the states list pointer. The states list pointer identifies the state of a current state sequence in the states list. Multiple state sequences can be stored in the states list. The advantage of the hierarchical linked list approach over hard coding is that the FSM can be easily changed by changing the contents of memory that include the linked lists.

Figure 4:
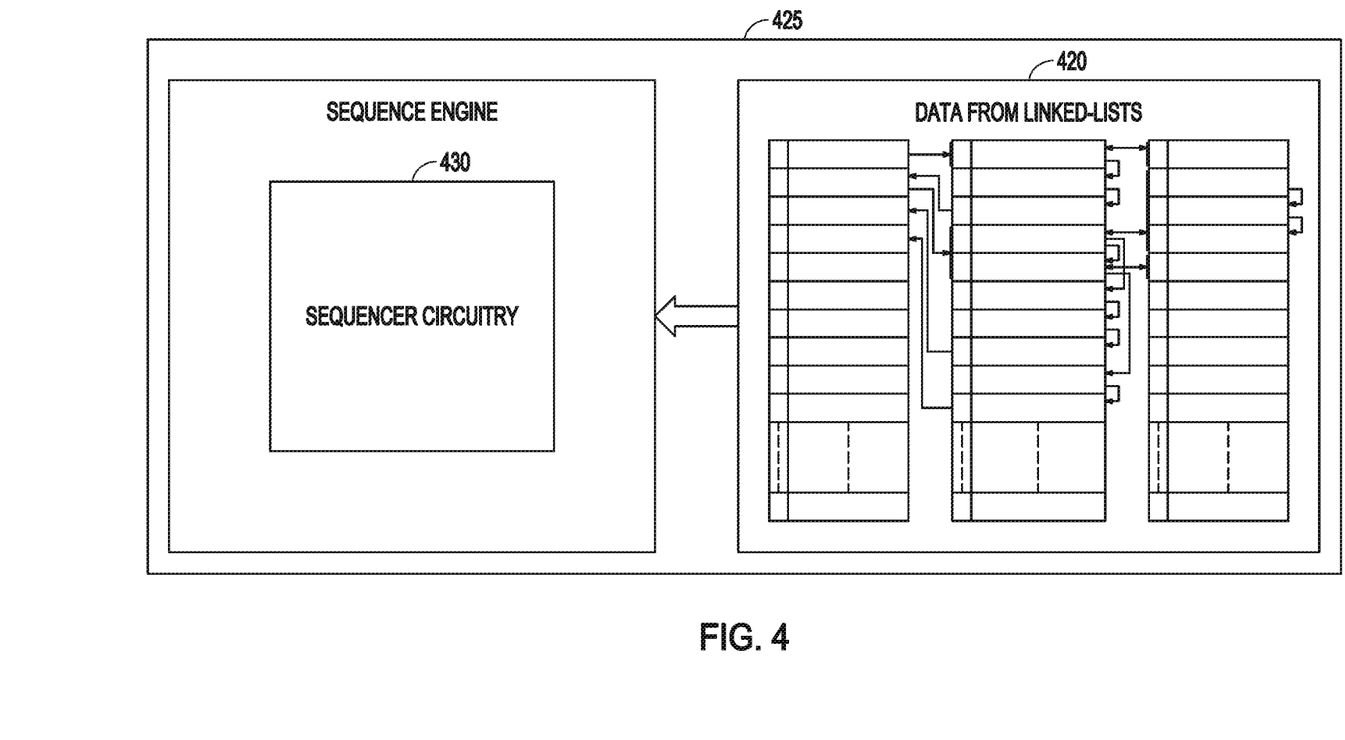
FIG. 4 is a bock diagram of portions of an example of an integrated circuit implementing a FSM using hierarchical linked lists.

FIG. 4 is a bock diagram of portions of an example of an IC 425 implementing a FSM using hierarchical linked lists. The hierarchical linked lists 420 are included in a memory that may be integral to the IC 425 or may be operatively connected to the IC 425. The IC 425 includes sequencer circuitry 430 to implement the states actions. The sequencer circuitry 430 can include one or more registers to receive control words from the hierarchical linked lists associated with the finite states of the IC. The control words may be stored in the actions list entries or otherwise indexed in the memory according to entries in the actions list. The sequencer advances the IC to the IC state that corresponds to the control word and performs one or more actions corresponding to the IC state, such as activating or deactivating a control signal or starting timer circuitry. The actions can be included in the actions list. The sequencer circuitry 430 can include logic circuitry to implement the one or more logic conditions included in the rules list, and advance the actions list pointer according to an outcome of the one or more logic conditions. The sequencer circuitry 430 may include one or more registers to hold one or more status words. For example, a status word may include the Fault conditions of the power supplies, or a status word may include an indication that a timer circuit has completed timing a particular duration.

The IC 425 may be included in a power supply sequencer as shown in the example of FIG. 2. The sequencer circuitry 430 may activate multiple power supplies in a sequence determined according to a sequence of the IC states specified by the hierarchical linked lists. In some embodiments, the power supplies provide voltage rails that define voltage domains of electronic system. The sequencer circuitry activates a plurality of voltage domains provided by the power supplies to an electronic system. The voltage domains are activated in a sequence determined according to the sequence of IC states in the linked lists. The sequencer circuitry may also deactivate the power supplies according to a specific sequence for powering the system down or when one or more power supply faults are detected.

A single power supply sequencer may not be adequate to meet the wide variety of number of rails required in different applications. The devices of the FSMs of the examples in FIGS. 3 and 4 can be scaled to a system of a larger number of voltage sequencer devices and power supplies. Configuring a large number of Power Supplies for an electronic system can be complicated.

Figure 5:
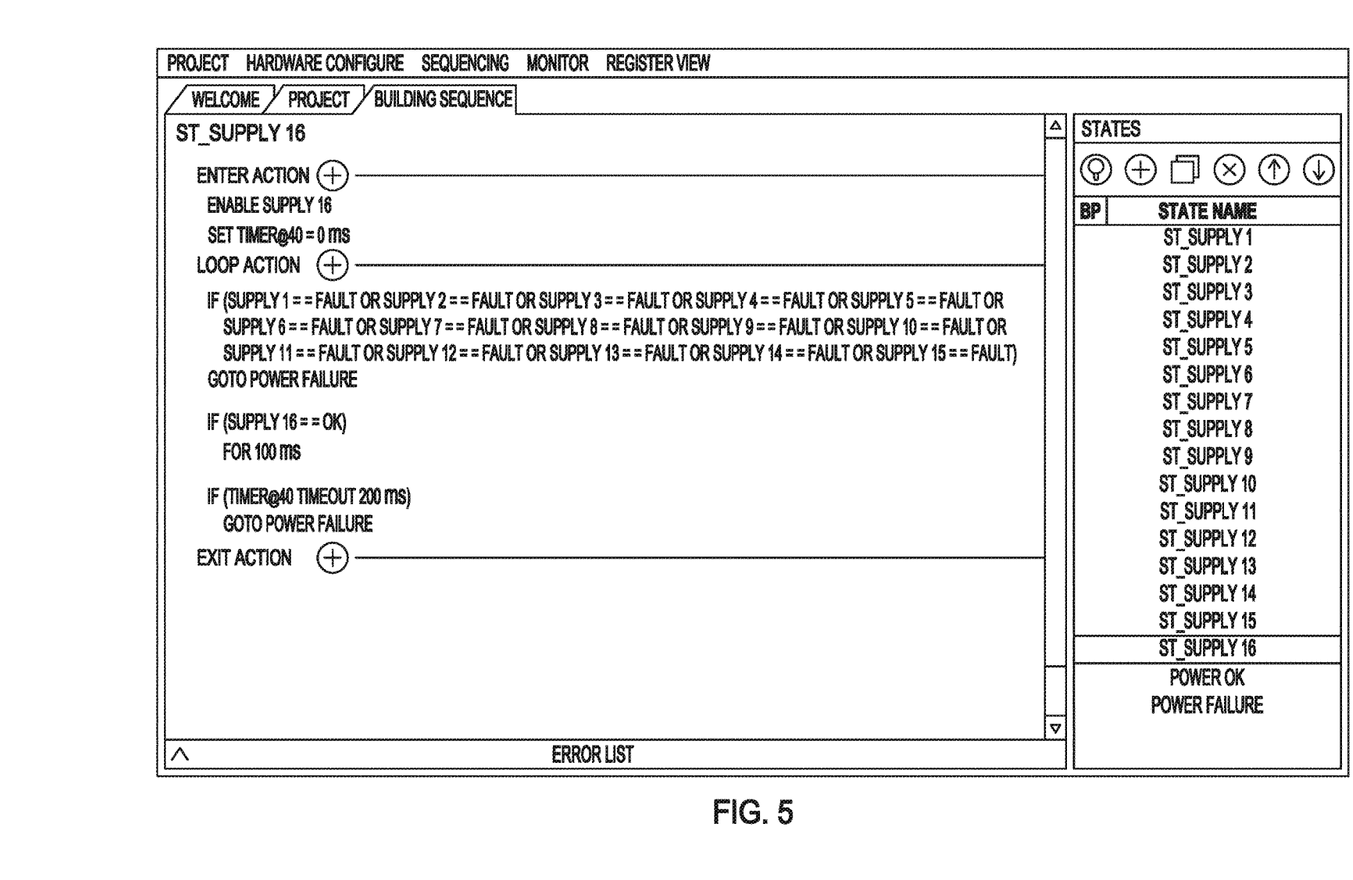
FIG. 5 is an example of a graphical user interface (GUI) used to configure finite state machines for integrated circuits.

FIG. 5 is an example of a graphical user interface (GUI) used to configure voltage sequencer devices for sixteen power supplies (ST_Supply 1 through ST_Supply 16) for an electronic system. The GUI may be displayed by a client application that configures voltage sequencer devices. The client may use a host computing system to communicate with the voltage sequencer devices. The Power Supplies may be numbered in order of their activation.

The GUI in FIG. 5 is shown configuring an action of the actions list and logic for the rules list for a specific state of the FSM for the system. The state includes the action of activating power supply ST_Supply 16. The state also includes the action of monitoring the powers supplies for faults. The rules list will return a value of true for a fault in any one of the power supplies. The operating status of the power supplies may be provided to registers of the voltage sequencer devices. The GUI may show the activation of the Power Supplies and may show any fault status of any of the Power Supplies.

Figure 6:
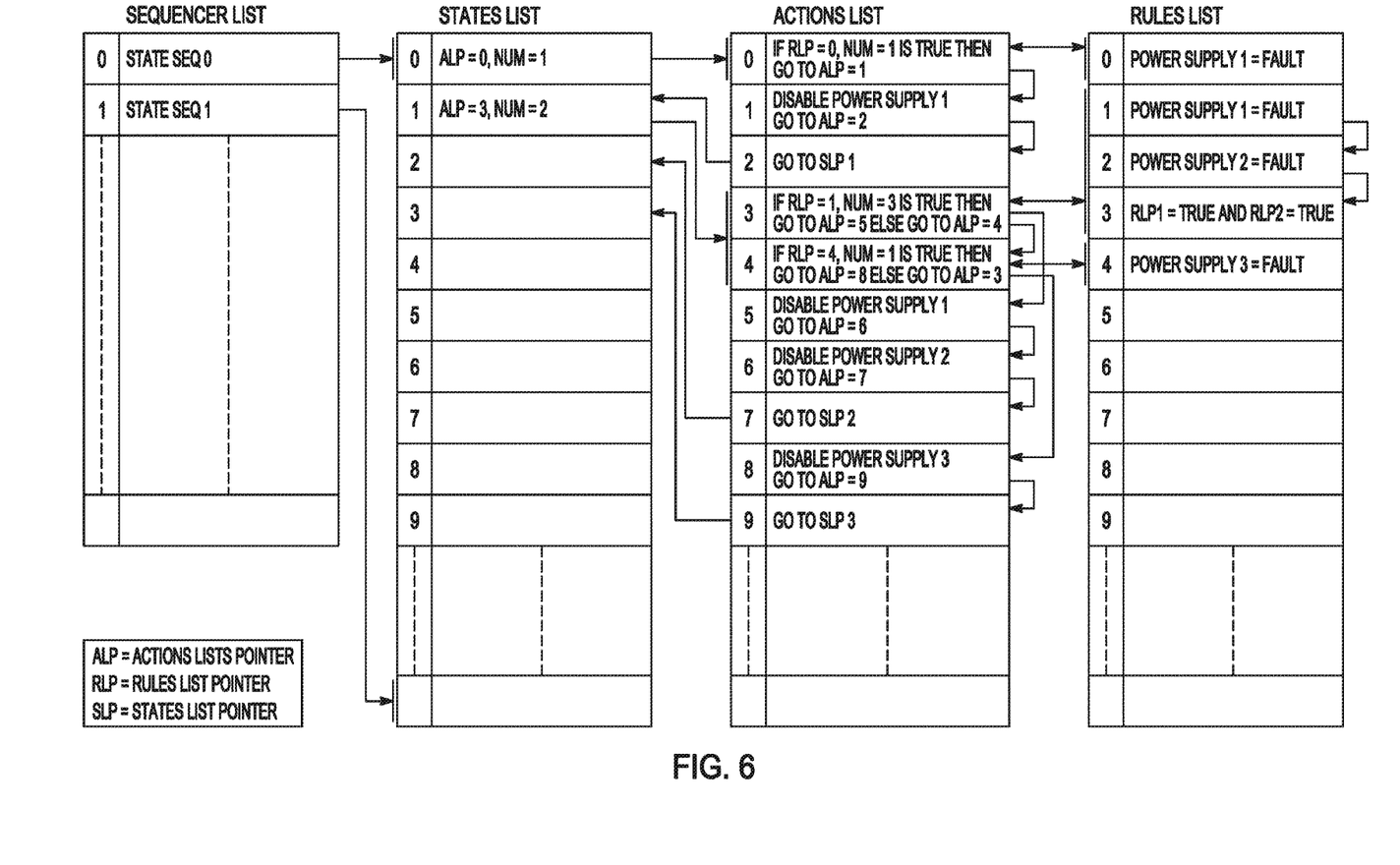
FIG. 6 is another example of a finite state machine implemented using hierarchical linked lists.

The GUI can be used to configure the individual voltage sequencer devices into an overall FSM to provide cohesive power supply sequencing that activates the voltage domains of the electronic system. The GUI configures logic for the FSM entered by a user into hierarchical linked lists, such as the sequencer list, states list, actions list and rules list shown in FIG. 6. The data from the linked lists may be programmed into an integrated circuit, such as to implement the sequencer engine in FIG. 4 for example. The sequencer engine processes the data to execute the FSM configured by the user using the GUI. The GUI can be used to configure linked lists for multiple voltage sequencer devices and multiple FSMs to control the devices.

Additional Description and Aspects

Aspect 1 can include subject matter (such as a logic sequencer) comprising an integrated circuit (IC) including sequencer circuitry, and a memory integral to or operatively coupled to the integrated circuit, wherein at least a portion of the memory is organized as a plurality of hierarchical linked lists defining a finite state machine of a plurality of finite IC states; wherein the sequencer circuitry is configured to: receive one or more control words from the hierarchical linked lists associated with an IC state; advance the IC to the IC state according to the one or more control words; and perform one or more actions corresponding to the IC state.

In Aspect 2, the subject matter of Aspect 1 optionally includes hierarchical linked lists that include a states list and an actions list, wherein the states list includes the available IC states and the actions list includes state actions performable by the IC, and wherein the states list includes an actions list pointer that identifies state actions of the actions list associated with a particular IC state.

In Aspect 3, the subject matter of one or both of Aspects 1 and 2 optionally includes hierarchical linked lists that include a rules list, wherein the actions list includes a rules list pointer and entries of the rules list identify one or more logic conditions associated with a state action of the actions lists.

In Aspect 4, the subject matter of Aspect 3 optionally includes sequencer circuitry that includes logic circuitry configured to implement the one or more logic conditions included in the rules list and advance the actions list pointer according to an outcome of the one or more logic conditions.

In Aspect 5, the subject matter of one or any combination of Aspects 2-4 optionally includes hierarchical linked lists that include a sequencer list that includes available IC state sequences and a states list pointer, wherein the states list pointer identifies the IC state of a current IC state sequence in the states list.

In Aspect 6, the subject matter of one or any combination of Aspects 1-5 optionally includes the sequencer circuitry being included in a power supply sequencer configured to activate a plurality of power supplies in a sequence determined according to a sequence of the IC states specified by the hierarchical linked lists.

In Aspect 7, the subject matter of one or any combination of Aspects 1-6 optionally includes the sequencer circuitry being included in a power supply sequencer configured to activate a plurality of voltage domains of an electronic system provided by the power supplies according to the sequence of IC states.

Aspect 8 includes subject matter (such as a power supply management system), or can optionally be combined with one or any combination of Aspects 1-7 to include such subject matter, comprising, a plurality of power supplies, wherein a power supply provides a supply voltage rail to a voltage domain of the system; an integrated circuit including sequencer circuitry electrically coupled to the plurality of power supplies; and a memory integral to or operatively coupled to the integrated circuit, wherein at least a portion of the memory is organized as a plurality of hierarchical linked lists defining a finite state machine including a plurality of finite IC states; wherein the sequencer circuitry is configured to: receive one or more control words from the hierarchical linked lists associated with an IC; advance the IC to the IC state according to the one or more control words; and perform one or more actions corresponding to the IC state to coordinate activation and deactivation of the power supplies.

In Aspect 9, the subject matter of Aspect 8 optionally includes hierarchical linked lists that include a states list and an actions list, wherein the states list includes the available IC states and the actions list includes state actions performable by the IC, and wherein the states list includes an actions list pointer that identifies state actions of the actions list corresponding to a particular IC state.

In Aspect 10, the subject matter of Aspect 9 optionally includes IC states included in the states list that include fault states for one or more of the power supplies, and the actions list include actions performable by the IC when the IC state includes a fault state.

In Aspect 11, the subject matter of Aspect 10 optionally includes hierarchical linked lists that include a rules list, wherein the actions list includes a rules list pointer and entries of the rules list identify one or more logic conditions associated with a state action of the actions lists.

In Aspect 12, the subject matter of Aspect 11 optionally includes sequencer circuitry that includes logic circuitry configured to implement the one or more logic conditions included in the rules list and advance the actions list pointer according to an outcome of the one or more logic conditions.

In Aspect 13, the subject matter of one or any combination of Aspects 9-12 optionally includes hierarchical linked lists that include a sequencer list that includes available IC state sequences and a states list pointer, wherein the states list pointer identifies the IC state of a current IC state sequence in the states list.

In Aspect 14, the subject matter of Aspect 13 optionally includes a sequencer list that includes a first state sequence to activate a first set of power supplies of the plurality of power supplies according to IC states of the first state sequence, and a second state sequence to activate a second set of power supplies of the plurality of power supplies according to IC states of the second state sequence.

In Aspect 15, the subject matter of one or any combination of Aspects 8-14 optionally includes sequencer circuitry configured to activate a plurality of voltage domains of the system provided by the power supplies according to the control words corresponding to the IC states of the hierarchical linked lists.

Aspect 16 can include subject matter (such as a method comprising acts, or a computer readable storage medium including instructions that, when performed by processing circuitry of a computing device, cause the computing device to perform the acts), or can optionally be combined with one or any combination of Aspects 1-15 to include such subject matter, comprising implementing a graphical user interface (GUI) on the computing device; receiving power supply voltage sequencer information via the GUI; and configuring, using the power supply voltage sequencer information, a finite state machine as a plurality of hierarchical linked lists stored in a memory, wherein the finite state machine includes a plurality of device states of a power sequencer device that determine an order of activation of a plurality of power supplies.

In Aspect 17, the subject matter of Aspect 16 optionally includes generating one or more control words stored in the memory and indexed according to the hierarchical linked lists; wherein the one or more control words correspond to an action performed by the power sequencer device when in a specified device state of the finite state machine.

In Aspect 18, the subject matter of one or both of Aspects 16 and 17 optionally includes configuring the hierarchical linked lists to include a states list and an actions list, wherein the states list includes the available device states and the actions list includes state actions performable by the device, and wherein the states list includes an actions list pointer that identifies state actions of the actions list corresponding to a particular device state.

In Aspect 19, the subject matter of Aspect 18 optionally includes configuring the hierarchical linked lists to include a rules list, wherein the actions list includes a rules list pointer and entries of the rules list identify one or more logic conditions associated with a state action of the actions lists.

In Aspect 10, the subject matter of one or any combination of Aspects 16-19 optionally includes configuring the finite state machine in one or more power supply sequencer devices, wherein a power supply sequencer device sequentially activates and deactivates power supplies to which it is connected according to the configured finite state machine.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

The invention claimed is:

1. A logic sequencer comprising:
   an integrated circuit (IC) including sequencer circuitry; and
   a memory integral to or operatively coupled to the integrated circuit, wherein at least a portion of the memory is organized as a plurality of hierarchical linked lists defining a finite state machine of a plurality of finite IC states; wherein the hierarchical linked lists include one or more pointers to identify one or more control words in the hierarchical linked lists associated with an IC state, and the sequencer circuitry is configured to: receive the one or more control words from the hierarchical linked lists; advance the IC to the IC state according to the one or more control words; and perform one or more actions corresponding to the IC state.

2. The logic sequencer of claim 1, wherein the hierarchical linked lists include a states list and an actions list, wherein the states list includes the available IC states and the actions list includes state actions performable by the IC, and wherein the states list includes an actions list pointer that identifies state actions of the actions list associated with a particular IC state.

3. The logic sequencer of claim 2, wherein the hierarchical linked lists include a rules list, wherein the actions list includes a rules list pointer and entries of the rules list identify one or more logic conditions associated with a state action of the actions lists.

4. The logic sequencer of claim 3, wherein the sequencer circuitry includes logic circuitry configured to implement the one or more logic conditions included in the rules list and advance the actions list pointer according to an outcome of the one or more logic conditions.

5. The logic sequencer of claim 2, wherein the hierarchical linked lists include a sequencer list that includes available IC state sequences and a states list pointer, wherein the states list pointer identifies the IC state of a current IC state sequence in the states list.

6. The logic sequencer of claim 1, wherein the sequencer circuitry is included in a power supply sequencer configured to activate a plurality of power supplies in a sequence determined according to a sequence of the IC states specified by the hierarchical linked lists.

7. The logic sequencer of claim 1, wherein the sequencer circuitry is included in a power supply sequencer configured to activate a plurality of voltage domains of an electronic system provided by the power supplies according to the sequence of IC states.

8. A power supply management system, the system comprising:
   a plurality of power supplies, wherein a power supply provides a supply voltage rail to a voltage domain of the system;
   an integrated circuit including sequencer circuitry electrically coupled to the plurality of power supplies; and
   a memory integral to or operatively coupled to the integrated circuit, wherein at least a portion of the memory is organized as a plurality of hierarchical linked lists defining a finite state machine including a plurality of finite IC states; wherein the hierarchical linked lists include one or more pointers to identify one or more control words in the hierarchical linked lists associated with an IC state, and the sequencer circuitry is configured to: receive the one or more control words from the hierarchical linked lists; advance the IC to the IC state according to the one or more control words; and perform one or more actions corresponding to the IC state to coordinate activation and deactivation of the power supplies.

9. The system of claim 8, wherein the hierarchical linked lists include a states list and an actions list, wherein the states list includes the available IC states and the actions list includes state actions performable by the IC, and wherein the states list includes an actions list pointer that identifies state actions of the actions list corresponding to a particular IC state.

10. The system of claim 9, wherein the IC states included in the states list include fault states for one or more of the power supplies, and the actions list include actions performable by the IC when the IC state includes a fault state.

11. The system of claim 9, wherein the hierarchical linked lists include a rules list, wherein the actions list includes a rules list pointer and entries of the rules list identify one or more logic conditions associated with a state action of the actions lists.

12. The system of claim 11, wherein the sequencer circuitry includes logic circuitry configured to implement the one or more logic conditions included in the rules list and advance the actions list pointer according to an outcome of the one or more logic conditions.

13. The system of claim 9; wherein the hierarchical linked lists include a sequencer list that includes available IC state sequences and a states list pointer, wherein the states list pointer identifies the IC state of a current IC state sequence in the states list.

14. The system of claim 13, wherein the sequencer list includes a first state sequence to activate a first set of power supplies of the plurality of power supplies according to IC states of the first state sequence, and a second state sequence to activate a second set of power supplies of the plurality of power supplies according to IC states of the second state sequence.

15. The system of claim 8, wherein the sequencer circuitry is configured to activate a plurality of voltage domains of the system provided by the power supplies according to the control words corresponding to the IC states of the hierarchical linked lists.

16. A non-transitory computer readable storage medium including instructions that, when performed by processing circuitry of a computing device, cause the computing device to perform acts comprising:

implementing a graphical user interface (GUI) on the computing device;

receiving power supply voltage sequencer information via the GUI; and configuring, using the power supply voltage sequencer information, a finite state machine as a plurality of hierarchical linked lists stored in a memory, wherein the finite state machine includes a plurality of device states of a power sequencer device that determine an order of activation of a plurality of power supplies, and the hierarchical linked lists include one or more pointers to identify, one or more control words in the hierarchical linked lists associated with the device states.

17. The non-transitory computer readable storage medium of claim 16, including instructions that cause the processing circuitry to generate the one or more control words stored in the memory and indexed according to the one or more pointers of the hierarchical linked lists; wherein the one or more control words correspond to an action performed by the power sequencer device when in a specified device state of the finite state machine.

18. The non-transitory computer readable storage medium of claim 16, including instructions that cause the processing circuitry to configure the hierarchical linked lists to include a states list and an actions list, wherein the states list includes the available device states and the actions list includes state actions performable by the device, and wherein the states list includes an actions list pointer that identifies state actions of the actions list corresponding to a particular device state.

19. The non-transitory computer readable storage medium of claim 18, including instructions that cause the processing circuitry to configure the hierarchical linked lists to include a rules list, wherein the actions list includes a rules list pointer and entries of the rules list identify one or more logic conditions associated with a state action of the actions lists.

20. The non-transitory computer readable storage medium of claim 16, including instructions that cause the processing circuitry to configure the finite state machine in one or more power supply sequencer devices, wherein a power supply sequencer device sequentially activates and deactivates power supplies to which it is connected according to the configured finite state machine.

* * * * *

UNITED STATES PATENT AND TRADEMARK OFFICE
CERTIFICATE OF CORRECTION

| | |
|---|---|
| PATENT NO. | : 10,310,476 B2 |
| APPLICATION NO. | : 15/958871 |
| DATED | : June 4, 2019 |
| INVENTOR(S) | : Dhanjal et al. |

Page 1 of 1

It is certified that error appears in the above-identified patent and that said Letters Patent is hereby corrected as shown below:

In the Claims

In Column 9, Line 25, in Claim 13, delete "claim 9;" and insert --claim 9,-- therefor In Column 10, Line 12, in Claim 16, delete "identify," and insert --identify-- therefor Signed and Sealed this
Twenty-first Day of April, 2020

Andrei Iancu
*Director of the United States Patent and Trademark Office*